United States Patent [19]

Chang

[11] 4,283,771
[45] Aug. 11, 1981

[54] ON-CHIP BUBBLE DOMAIN RELATIONAL DATA BASE SYSTEM

[75] Inventor: Hsu Chang, Yorktown Heights, N.Y.

[73] Assignee: International Business Machines Corporation, Armonk, N.Y.

[21] Appl. No.: 929,584

[22] Filed: Jul. 31, 1978

[51] Int. Cl.³ .................. G11C 11/14; G11C 19/00; G11C 15/02
[52] U.S. Cl. ........................ 364/900; 365/2; 365/15
[58] Field of Search .............. 365/1, 4.5, 14, 15, 365/16, 49, 50, 69, 73, 77, 78; 340/146.2; 364/900 MS File, 200 MS File

[56] References Cited

U.S. PATENT DOCUMENTS

| | | | |
|---|---|---|---|
| 3,465,303 | 9/1969 | Koerner | 365/49 |
| 3,618,054 | 11/1971 | Bonyhard | 365/15 |
| 3,701,125 | 10/1972 | Chang et al. | 365/4 |
| 3,786,445 | 1/1974 | Ho et al. | 365/1 |
| 3,831,152 | 8/1974 | Perneski et al. | 365/1 |
| 3,969,707 | 7/1976 | Lane et al. | 365/49 |
| 3,997,880 | 12/1976 | Chen et al. | |
| 3,997,882 | 12/1976 | Goyal | 365/49 |
| 4,032,905 | 6/1977 | Chen | |
| 4,040,018 | 8/1977 | Chang et al. | |
| 4,053,871 | 10/1977 | Vidalin et al. | 364/900 |
| 4,064,556 | 12/1977 | Edelberg et al. | 364/900 |
| 4,085,451 | 4/1978 | Chen et al. | 365/14 |
| 4,128,891 | 12/1978 | Lin et al. | 364/900 |

OTHER PUBLICATIONS

IBM Tech. Disc. Bull., vol. 18, No. 2, Jul. 1975, Chang and Lee, pp. 598–602.
IBM Tech. Disc. Bull., vol. 18, No. 11, Apr. 1976, Chang and Cohen, pp. 3856–3858.

*Primary Examiner*—Gareth D. Shaw
*Assistant Examiner*—E. Chan
*Attorney, Agent, or Firm*—Jackson E. Stanland

[57] ABSTRACT

A bubble domain chip is designed to provide the components necessary to perform all essential data-base functions. Many cross-linked loops in parallel allow the interchange of distinct columns of information. The use of an on-chip decoder achieves effective interchangeability of distinct rows of information. Thus, the basic storage structure and access modes conform to the high-level view of data implied by the relational data model, resulting in simpler programming. In addition, a plurality of comparators are provided to the plurality of storage loops to perform context search simultaneously on all the loops. The simultaneous search and the restriction to output of only qualified data greatly reduces the query time.

13 Claims, 6 Drawing Figures

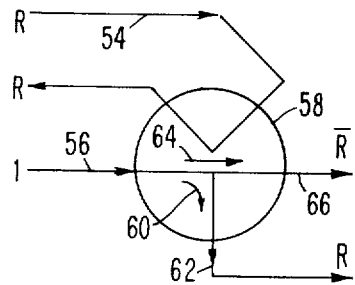
FIG. 3
FIG. 4
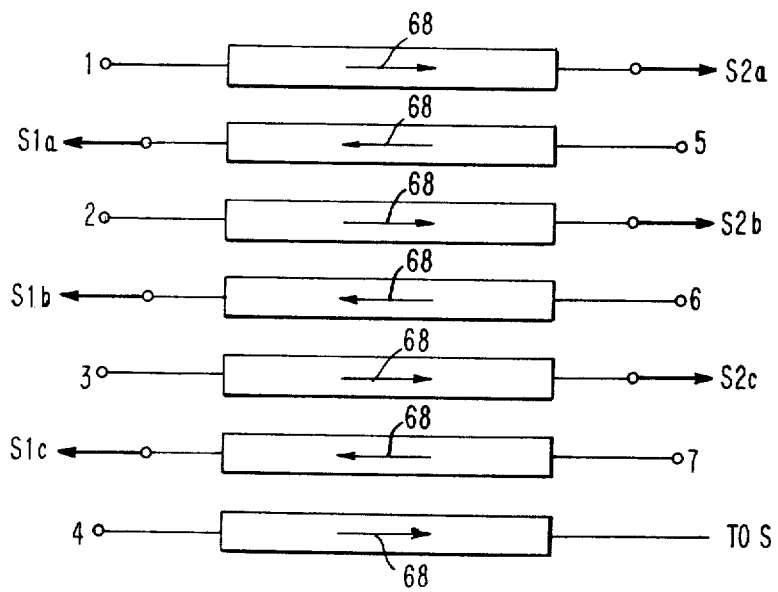
FIG. 5

ON-CHIP BUBBLE DOMAIN RELATIONAL DATA BASE SYSTEM

DESCRIPTION

1. Technical Field

This invention relates to a magnetic bubble domain relational data base system, and in particular to such a system where storage, data rearrangement, associative search, accessing, and qualification indication are provided on the magnetic chip, rather than external to the magnetic chip as is done in the prior art. Significant performance improvement and programming simplification are achieved.

2. Background Art

In the science of computer technology and in particular data base systems, concepts and hardware to facilitate the implementation of these systems have shown significant advances in recent years.

A data base can be considered as a structured collection of data which is accessible by concurrent users through computer systems. A relational model of data base, first described by E. F. Codd, Communications of the ACM, Volume 13, No. 6, p. 377, June 1970, views data in tabular form with a set of similar entries arranged in rows (tuples), and their many attributes aligned in columns (domains). A relational data base is a collection of many such tables. The items in the table may vary with time because of modifications, insertions, and deletions. Data in two or more relations (i.e., tables) can be interrelated through compatible attributes which appear in each of the relations. This allows the user to execute queries which have extensive selection criteria.

Thus, a relational data base system does not organize data in a rigid fashion. Many different sets, or relations, of data may be stored in an array where accessing of any of the tables of data may be accomplished by simply naming the relation and those domains (columns) of the relation that are desired.

Relational data base systems are an attempt to simplify the user's view of information in the entire data base. In this system, the relation is viewed as a table of columns and rows. For example, a table may be entitled "Employee" and may contain columns having attribute headings such as "Name", "Department", "Salary". This table, or "relation" is then an organized collection of data relating to the employee, while the various column headings in the table are the different attributes contained within the table itself. Another table may include as a column therein one of the columns in the "Employee" table. For example, the column "Name" may appear in another table which relates employees to their managers and their salary levels.

From the user's point of view, the relational data base system can be used to make new tables and to answer inquiries which the user has relative to the information needed in his own business or personal affairs. For example, the user can use common attributes in two tables to obtain additional relations between the data and to construct a new table. In one such operation, a user can look to a common attribute (such as "name") which appears in the two aforementioned tables and can then construct another table comprised of columns from the first and second tables. In this way, he can create a new relation which has columns which previously were not combined in any single table. Thus, relational data base systems are highly user-oriented and are very useful in the operation of certain businesses, as well as for other purposes.

Technical articles generally dealing with relational data base systems include the following:

1. C. S. Lin et al, ACM Transactions on Data Base Systems, Volume 1, No. 1, March 1976, pp. 53–65.

2. E. A. Ozkarahan et al, "RAP-An Associative Processor for Data Base Management", Proceedings AFIPS 1976, National Computer Conference, Volume 44, pp. 379–388.

3. Computer Systems Research Group, University of Toronto, Toronto, Canada, Report M5S1A4 (to appear as number 30 of ENGINEERING FORUM, a publication of the Facility of Applied Science & Engineering of the University of Toronto, Toronto, Ontario, Canada).

4. S. A. Schuster et al, "A Virtual Memory System for a Relational Associative Processor", AFIPS Proceedings, Volume 45, p. 861, 1976.

5. B. Hsiao and S. Madnick "Data Base Machine Architecture in the Context of Information Technology Evolution", Proceedings of the 3rd International Conference on Very Large Data Bases (IEEE publication 77CH1268-2), pp. 67–68, 1977.

Copending application Ser. No. 755,892, filed Dec. 30, 1976, now U.S. Pat. No. 4,128,891 describes a relational data base system comprised of magnetic bubble chips for storage, and off-chip logic for content search. Information is stored in tables using a hybrid major/minor loop storage and a decoder form of memory organization, wherein individual rows of the tables can be selectively accessed.

Additional copending application Ser. No. 902,641, to H. Chang et al, filed May 4, 1978, describes a relational data base system using magnetic bubble domain storage where dynamic indexing loops are used to provide cumulative search and update of match/mismatch situations.

None of the prior relational data base systems has been implemented completely on the magnetic bubble domain chip. It is a primary purpose of the present invention to provide a completely on-chip relational data base system. However, the present invention is more than just the utilization of on-chip components for such a system; it is a system design which provides advantages over the prior art, and particularly with respect to the search and output time. In the present invention, all tuples can be searched simultaneously where the searches are activated by a single current line. Only completely qualified data is read out and the speed of the present device is several orders of magnitude faster than prior systems, including those using bubble domain storage.

In the practice of the present invention, an observation is made that there is a natural correspondence between the tabular form of the relational data model and the array-like solid state storage devices such as bubble domain chips, as well as between the set-oriented query operations and the group-coordinated bubble manipulations. As noted in the cited references, several proposals have been made to couple microprocessors to rotating memories, such as disk memories, for relational data base implementation. In the present invention, the state of the art is advanced not only by implementing storage on the magnetic chip, but also by implementing search, retrieval, and reordering of data on the magnetic chip. This achieves a higher degree of integration in hardware and operation, as well as moving the implementation closer to the high level view implied by the relational model. As will be more apparent from the detailed description of the preferred embodiments, the present invention will provide simultaneous search and then uninterrupted read-out of selected (qualified) data for fast input/output operations. The user's view of the data is not constrained by this structural implementation. The structures are also amenable to high level language. The structure is immediately useful for small capacity query machines. In the case of the users of large-capacity data base, the structure remains useful as high-density, large-capacity storage becomes available.

Accordingly, it is a primary object of the present invention to provide a relational data base system using magnetic bubble domain devices, all of which are located on the magnetic bubble domain chip.

It is another object of the present invention to provide a complete on-chip magnetic bubble domain relational data base system which has search and retrieval advantages over prior relational data base systems.

It is yet another object of the present invention to provide a completely on-chip magnetic bubble domain relational data base system utilizing simultaneous search and read-out of only selected data for enhanced input/output operations.

It is another object of the present invention to provide a magnetic bubble domain relational data base system, in which the components for storage, data rearrangement, associative search, data access, and data indication are on the magnetic bubble domain chip.

BRIEF SUMMARY OF THE INVENTION

A magnetic bubble domain chip is configured to facilitate relational data base operations. Data selection and rearrangement is on the magnetic chip in order to minimize data traffic through the limited number of I/O ports and to facilitate data access in response to different user views.

The major components on the relational bubble chip are storage means, data rearrangement means, associative search means, access means, and indicator means.

The storage means is comprised of many non-volatile, non-destructive read-out shift registers which are capable of start and stop of data movement, and data reversal. The shift registers are arranged in parallel, and each is segmentized into cross-linked loops. The rows of shift registers correspond to tuples, and columns of loops correspond to domains in a relational data base.

The data rearrangement means is broadly comprised of the cross-linked loops in the shift register storage, there being binary switches between each of the segments in each shift register. This means that information in one segment can be interchanged with information in an adjacent segment to provide column interchange. Various data rearrangements can be achieved including topping, FIFO, FILO, sorting, etc. In the present design, the cross-linked loops are mostly used for rearranging columns of information to facilitate associative search and retrieval operations.

An associative search means is provided for each of the shift registers on the magnetic chip. Generally, each associative search means includes a complementary gate for providing a complementary stream of data and a comparator/gate for providing content or context search. The parallel arrangement of associative search means identifies simultaneously all entries from the shift registers which contain a given attribute or a Boolean combination of attributes. Only the identified entries are retrieved through the limited number of output ports. Thus, only matched data is outputted in order to reduce the traffic in I/O facilities. Speed is improved both by the simultaneous search operation and by limiting the traffic to qualified data items only in the output facilities.

The access means can be comprised of different arrangements. For random access, a decoder is directly coupled to the output of the associative search means. This provides random access to any of the shift registers for write-in and read-out of information.

Another embodiment for the access means utilizes a convertible switch structure such as that shown in U.S. Pat. No. 3,967,263. This type of convertible structure is used for serial access of information from each of the shift registers and is used with buffer loops which are connected to the outputs of the associative search means. The buffer loops can be converted from parallel to serial connection so that selected data in each column of the buffer loops can be serially accessed via one I/O port.

Buffer loops can also be used with a decoder to allow write-in, read-out, insertion, deletion, and rearrangement of data for the shift registers in the buffer loops via the decoder, without affecting the other shift registers on the chip.

Indicator means, comprising dedicated shift registers, are used to provide an indication of the occupancy status of the shift registers. For example, an occupancy-indicator shift register is located at one end of and orthogonal to all the storage shift registers. Each shift register, when written-in, contains an occupancy bubble which can be transferred or replicated into the indicator shift register. The indicator register, being a much shorter register, and without having to go through the buffer registers, is used to quickly indicate the occupancy status of all the shift registers and where new data entries can be entered.

All data base interrogate and update operations can be handled by this on-chip relational data base system. Commercially available bubble chip controllers and a directory are used to provide the necessary current inputs to the on-chip devices for write-in, read-out, data rearrangement, data transfer, associative search, and serial/random access.

The directory keeps track of the storage locations of the various relations, or tables, which are in storage in individual bubble chips. The bubble chip controllers for each chip receive inputs from the directory and are used to select particular columns of data for access operations.

A plurality of bubble domain relational data base chips are used to provide a complete relational data base system. For example, each chip contains a single table of data, and means are provided for interconnecting individual magnetic chips so that relations can be combined to form new relations. For this purpose, registers on the chip or external to the chips are used to provide criteria (via the search line) for comparison at the comparator gates on each of the magnetic chips. Information taken from one magnetic chip can be utilized to determine test criteria for data in the associative search means of a second magnetic chip. As a consequence of the matches/mismatches with data in the second magnetic chip, a new table, or relation, can be formed in a third magnetic chip.

These and other objects, features, and advantages will be more apparent from the following more particular description of the preferred embodiments.

BRIEF DESCRIPTION OF THE DRAWINGS

FIG. 3 shows a magnetic gate which will provide a data stream complementary to an input data stream. This complement gate is used together with a comparator gate to provide on-chip associative search means.

FIG. 4 shows the use of a storage chip to store data in tabular form, where rows (tuples) of information are stored in each of the shift registers, and columns of information are stored in columns of cross-linked loops associated with each shift register.

FIG. 5 shows a convertible structure for use when serial access of comparator outputs is required.

DETAILED DESCRIPTION OF THE PREFERRED EMBODIMENTS

The general description of a relational data base system is provided in the cited literature references. Each such system includes storage means for storing data, comparison means for comparing data to a test criterion, access means, and indicator means for keeping track of the occupancy of certain portions of the storage means. In the past, magnetic disks or other magnetic storage have been used in combination with off-chip means (i.e., external to the storage chip) for providing relational operations. For example, the prior art has used the magnetic medium only for storage of information while data rearrangement and associative search, etc. have been carried out using external means, such as semiconductor circuits and computer processing units. While this has resulted in an improvement in system performance, the structure of the present invention provides all the necessary components on the storage chip itself in a manner which provides the ultimate system advantages. For example, in the present system, search of data items proceeds in parallel so that multiple tuples can be searched at the same time, in contrast with prior art systems where one tuple at a time is searched. Still further, segmentized storage of information is used to allow data rearrangement in a straightforward and direct way without interfering with other information in the same shift register, and without requiring readout of information from the register. This in turn eliminates the need for additional buffer registers.

BUBBLE DOMAIN CHIP (FIG. 1)

Figure 1:
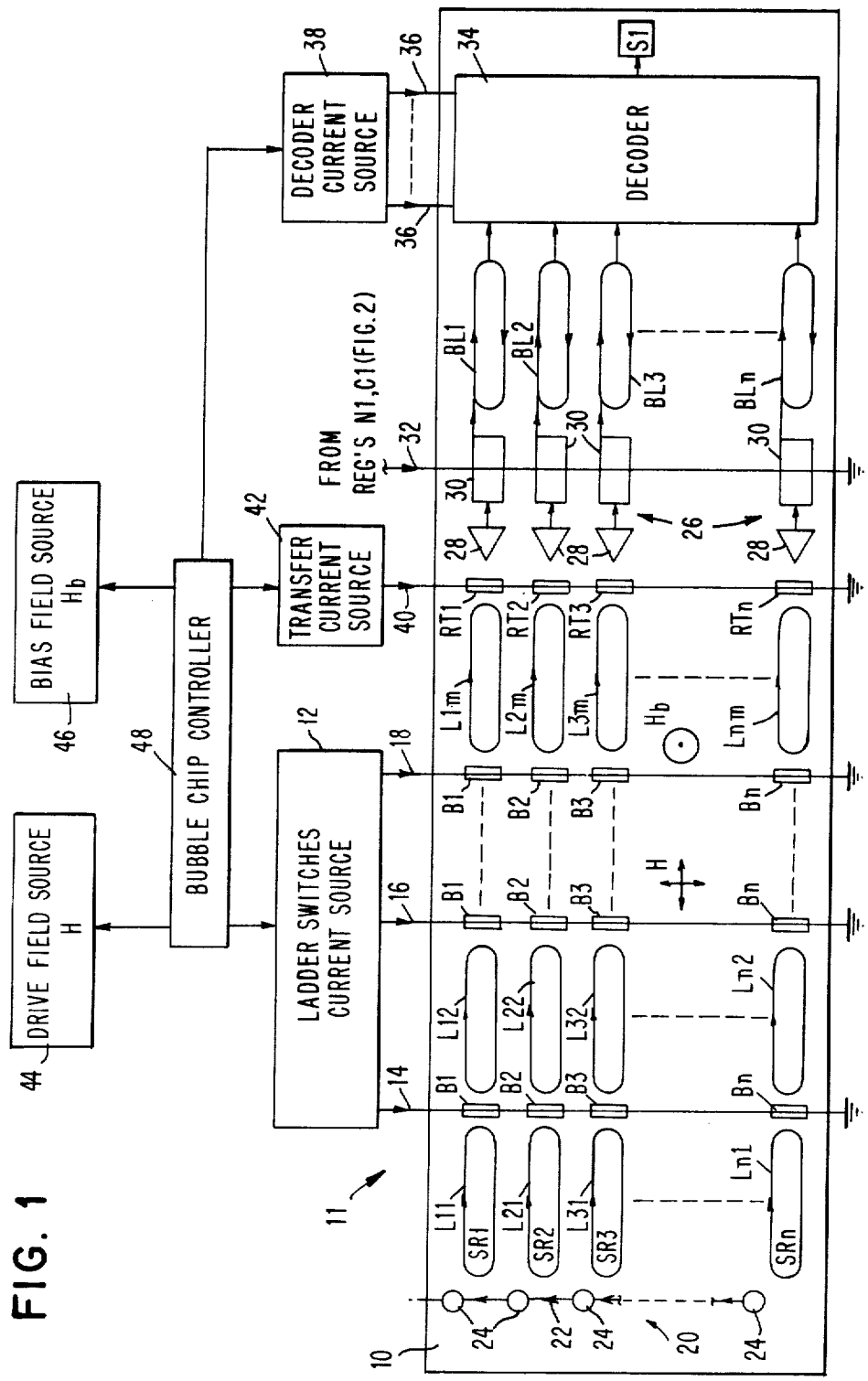
FIG. 1 shows a magnetic bubble domain chip which can be used to store a complete table, or relation, of data, and which has on-chip storage, data rearrangement, associative search, and random or serial access.

FIG. 1 shows a magnetic bubble domain chip C1 which includes on-chip storage, data rearrangement means, associative search means, access means, and indicator means. The current sources used to provide inputs to the various on-chip components are also shown, as are the drive field source, bias field source, and bubble chip controller.

In more detail, chip C1 is comprised of a substrate 10, including a magnetic medium in which bubble domains can be propagated, and various bubble domain devices located adjacent to substrate 10. A storage means 11 is broadly comprised of a plurality of rows of shift registers SR1, SR2, SR3,-SRn. The shift registers SR1-SRn are arranged in parallel, and each is segmentized into cross-linked loops. For example, shift register SR1 is comprised of cross-linked loops L11, L12,-L1m. The rows of shift registers correspond to tuples, and columns of loops correspond to domains in a relational data base. This will be described in more detail with respect to FIG. 4.

The loops in any shift register row are cross-linked by binary switches B1, B2, B3,-Bn. For example, the loops L11-L1m in the first shift register row are individually linked by binary switches B1, while the loops L31-L3m in the third shift register are cross-linked by binary switches B3. These switches are activated by current pulses from current source 12, where the current pulses travel along conductors 14, 16, and 18. Depending upon the currents in these conductors, the states of the binary switches B1-Bn can be changed to interconnect adjacent loops or to detach adjacent loops.

In accordance with the design shown in FIG. 1, a current carrying conductor for the binary switches is common to all binary switches in a column. For example, conductor 14 is used to simultaneously activate switches B1, B2, B3,-Bn located between the left-most pair of loops in registers SR1, SR2,-SRn.

The segmentized shift register loops and the associated binary switches are described in more detail in U.S. Pat. Nos. 4,040,018 and 3,997,880. As will be recognized, the individual shift registers and associated binary switches form a "ladder" structure as described in those patents. The binary switches have two states: one in which adjacent segmentized loops are separate from one another so that data circulates independently in each of the loops, and a second state in which adjacent loops can be interconnected so that data in one loop will follow a propagation path which brings it into the adjacent loop, and vice versa. Thus, the binary switches can be used to interchange data between segmentized loops. For example, if it is desired to have the data in the left-most column of loops L11, L21,-Ln1 be exchanged with the data in loops L12, L22,-Ln2, a current pulse is placed on conductor 14 which will interconnect the adjacent left-most loops in registers SR1-SRn. This is how data rearrangement is achieved in the present invention. By proper sequences of the various data operations that can be achieved using the structure of U.S. Pat. No. 4,040,018, different data rearrangements can be achieved including first in-first out, first in-last out, sorting, etc. In the present application, rearrangement of columns of information is used to enhance accessing of information for comparison in an on-chip associative search device.

An occupancy indicator 20 is used to indicate the occupancy status of all of the shift registers SR1-SRn. Indicator 20 is comprised of a bubble domain shift register, indicated by arrows 22, which propagates bubbles 24 to a sensor (not shown). The occupancy-indicator shift register 22 is at the left-hand end of and orthogonal to the storage shift registers SR1-SRn. Each shift register SR1-SRn, when written-in, contains an occupancy bubble which can be replicated into the indicator shift register 22. Therefore, replicate-transfer switches are located at the left-hand end of the loops L11, L21,-Ln1. These well known replicate-transfer switches are not shown here for ease of illustration. They are used to replicate the occupancy bubbles into the indicator 20. Since the indicator register 20 is a short register, it can quickly indicate the occupancy status of all the shift registers, and where new data entries can be entered.

As indicated previously, data rearrangement means is provided by the binary switches which cross-link the segmentized loops in each shift register. Depending upon the activation of the binary switches by currents from source 12, data in the left-hand most loops can be transferred to the right-hand side of each of the shift registers for access to the associative search devices associated with each of the registers.

An associative search means 26 is provided for each of the storage registers SR1-SRn. Associative search means 26 is comprised of current-controlled bubble latches such as are shown in IBM Technical Disclosure Bulletin, Volume 18, No. 11, pp. 3856-3858, April 1976. These devices are also described by S. Y. Lee and H. Chang in an article entitled "Associative Search Bubble Devices for Content-Addressable Memories", COMPCON Fall 1975, Paper 8.2. Each associative search device includes a complementary gate 28, which is used to provide the complement of the data stream removed from a coupled storage register SR1-SRn. The associative search means also includes a comparator gate 30, which is current controlled. All comparator gates 30 in a column receive the same current inputs along conductor line 32. These current inputs correspond to test criteria against which comparisons are to be made for match/mismatch. Registers N1 and C1 (FIG. 2) are used for this purpose. As will be more apparent later, the test criteria either can be data from another bubble domain chip, or externally provided criteria.

Associative search, which can be either content or context addressing in the present invention, identifies simultaneously all entries which contain a given attribute or a Boolean combination of attributes. Thus, all tuples from a column of tuples are searched simultaneously in this invention. Only those entries for which a match is determined are able to leave the associative search devices 26 for propagation to the buffer loops BL1, BL2, BL3,-BLn.

As explained in the aforementioned Technical Disclosure Bulletin and COMPCON articles, the associative search devices use switches having memory capability, i.e., latches. The on or off state of the memory is controlled by the presence or absence of a bubble on the latch. In turn, this is determined by the coincidence of a current pulse (test criterion) and a bubble (data) from the data in the shift register. This basic element enables an associative search function in which the latches for parallel shift registers SR1-SRN share a common tag conductor 32. These latches are adaptable for variable tag lengths and each latch can perform AND and NEGATION functions. Latches in parallel can perform OR functions.

The associative search is performed by the interaction of each bubble stream (from each word in the shift registers) and the tag currents (operating on all words) on conductor 32. The results are registered in a loadable switch (latch) provided for each word. After the search, the matched words will keep their propagation passages open for subsequent interrogation while the mismatched words will have their passages sealed by loading a bubble onto a latch, thus preventing interrogation. This means that only matches will be delivered to the buffer loops BL1-BLn.

The loadable-disk latches described in this reference literature have three features which make them very useful in the practice of the present invention. First, a propagation passage can be sealed only when a bubble is approaching the latch. When the latch is unloaded, it will not affect the propagation of bubbles through the passage. The latch is loaded by activating a transfer current along conductor 32 to have a bubble reside on the permalloy disk comprising the latch. Once a latch is loaded, a bubble residing in it will repel incoming bubbles and prevent them from passing through the passage. To clear the latch, a clearing current is applied.

Second, transfer of a bubble to the latch is effected only with the coincidence of the bubble and the activation current. Third, a sealed latch remains sealed until it is cleared. To clear a latch, a clearing current is applied which forces the residing bubble out of the latch.

As noted in these cited references, an associative search procedure can be accomplished using the complementary gates 28 and comparators 30. A sequence of current pulses in the conductor 32 is used to represent the tag information. When a tag is specified, all words (that is, shift registers SR1-SRN) which do not have identical tags are to be sealed. Searching consists of the following steps:

1. Transfer current pulses are used to represent the complemented tag.
2. Bubbles from the shift registers interact with the complement-tag currents at the latches in the comparators 30. This seals off shift registers which contain ONES, where the tag bit is ZERO.
3. The transfer current pulses are used to represent the tag.
4. Bubble streams from all shift registers are inverted before they travel into the latches. This is achieved by an inverter inserted in a shift register.
5. The inverted bubble streams are interacted with the tag current at the latches. This will further seal-off shift registers which contain ZEROS where the tag bit is ONE.
6. The unsealed shift registers have the specified tags. That is, they contain matches and the information from the comparators then goes to the associated buffer loops.

The hardware and search procedure for associative search can be simplified, as will be appreciated by those of skill in the art. For example, the number of cycles required for search can be reduced by appropriate design changes.

The bubble associative devices used in this relational data base system provide three distinct system advantages. First, since the shift registers circulate their entire content to the associative search devices, there is minimum per-bit overhead resulting from the associative search logic. By contrast, when random-access memory cells are provided with associative search capability on a per-cell basis, as is done in prior art associative search systems each cell, and consequently the entire chip size, are made four or five times larger. Second, since the search device has memory capability, one cell suffices for any length of search attribute. Third, the search attribute is conveyed by the magnetic field gradient associated with a conductor current. Hence, by varying the current pulse pattern Boolean functions such as OR, NEGATION, and NOR can be executed. Additionally, the use of two consecutive search cells allows executions such as AND, NAND, $A \leq B$, etc.

Access means is provided by the decoder 34, which can also be located on the magnetic bubble domain chip. The cited IBM Technical Disclosure Bulletin shows the use of a decoder in combination with the associative search structure. Additionally, magnetic bubble domain decoders are shown in U.S. Pat. No. 3,858,188 and U.S. Pat. No. 4,028,672. For the practice of this invention, the associative search-decoder combination of IBM Technical Disclosure Bulletin, Volume 18, No. 2, July 1975, on pages 598–602 is suitable.

Decoder 34 allows any of the shift registers SR1-SRN to be accessed randomly if both the associative search gate remains open and the proper decoder control lines are activated.

These control lines are current carrying conductors 36, which are electrically connected to the decoder current source 38. Random access of any shift register allows write-in, read-out, insertion, deletion, and rearrangement of data for the shift register. These operations can be done in the buffer loops BL1-BLn and the decoder without affecting the other shift registers on the magnetic chip. Information read from the decoder is detected by the sensor S, which is, for example, a magnetoresistive detector as described in U.S. Pat. No. 3,691,540.

As an alternative to the use of a decoder to provide random access of the matched outputs on the storge shift registers, a convertible structure such as that shown in U.S. Pat. No. 3,967,263 can be used to convert the buffer loops from a parallel arrangement to a serial arrangement of these loops. In that situation, selected data in each column of buffer loops can be accessed via one I/O port. The system configuration using the convertible structure is shown in FIG. 5.

In the accessing technique of the present invention, it should be noted that both random access and serial access is easily provided. In both situations, only one input/output port is required per chip. Of course, one reason for this is that only qualified data (that is, data for which a match has been indicated) is allowed to pass from the associative search devices 26 to the buffer loops BL1-BLn. As an alternative, the output passages of the associative search devices 26 can be directly entered into the decoder 34 rather than using the buffer loops. However, use of the buffer loops allows operations such as those of insertion, deletion, etc. in the buffer loops. Such editing operations are easily provided using the freeze/bypass loops shown in U.S. Pat. No. 3,950,732.

When information in storage is to be transferred to the associative search devices 26, replicate/transfer switches RT1, RT2, RT3, . . . RTn are used. These are conventional replicate/transfer switches which are current actuated by currents in conductor 40. These currents are provided by the transfer current source 42. Representative replicate/transfer switches suitable for use in the present invention include those shown in U.S. Pat. No. 4,012,726 and U.S. Pat. No. 4,079,359. Such switches are characterized by the use of a replicator which replicates the information to be transferred so that the information will remain in storage as well as being transferred to another propagation path. This provides non-destructive read-out.

As is well known in the art, propagation of bubble domains in substrate 10 occurs as a magnetic drive field H reorients in the plane of the substrate. This drive field is provided by the drive field source 44, which is commonly provided by current carrying coils surrounding substrate 10. The size of the magnetic bubble domains in substrate 10 is stabilized by the bias field $H_b$, which is supplied by bias field source 46. This source is also well known in the art, and can also comprise current carrying coils or permanent magnets.

A bubble chip controller 48 provides inputs to field sources 44 and 46, as well as to the current sources 12, 38, and 42. Prototypes of these bubble chip controllers are commercially available, and future improvements could incorporate various instruction sets. An example of a bubble chip controller is the Texas Instruments TMS9916 Controller which is available for use with a TI0103 magnetic bubble domain chip. This chip is capable of storing 92K useful bits in a major/minor loop organization and includes a detector and current controlled bubble nucleator. Commercially available bubble domain chips have been described by J. E. Juliussen in IEEE Electro 77, Professional Program, "Update on Bubble Memories", Paper 12.5, New York, April 19–21, 1977, and also in *Electronics*, Volume 50, No. 16, pp. 81–86, Aug. 4, 1977.

In contrast with prior art relational data base systems having magnetic bubble domain storage, the present system includes all magnetic bubble domain components. This provides many system advantages and in particular the use of parallel search of all tuples in storage provides orders of magnitude improvement in speed. In addition, the high degree of integration provided in the present system conforms more closely to the high level view implied by the relational model of data, resulting in simpler programming.

RELATIONAL DATA BASE SYSTEM (FIG. 2)

Figure 2:
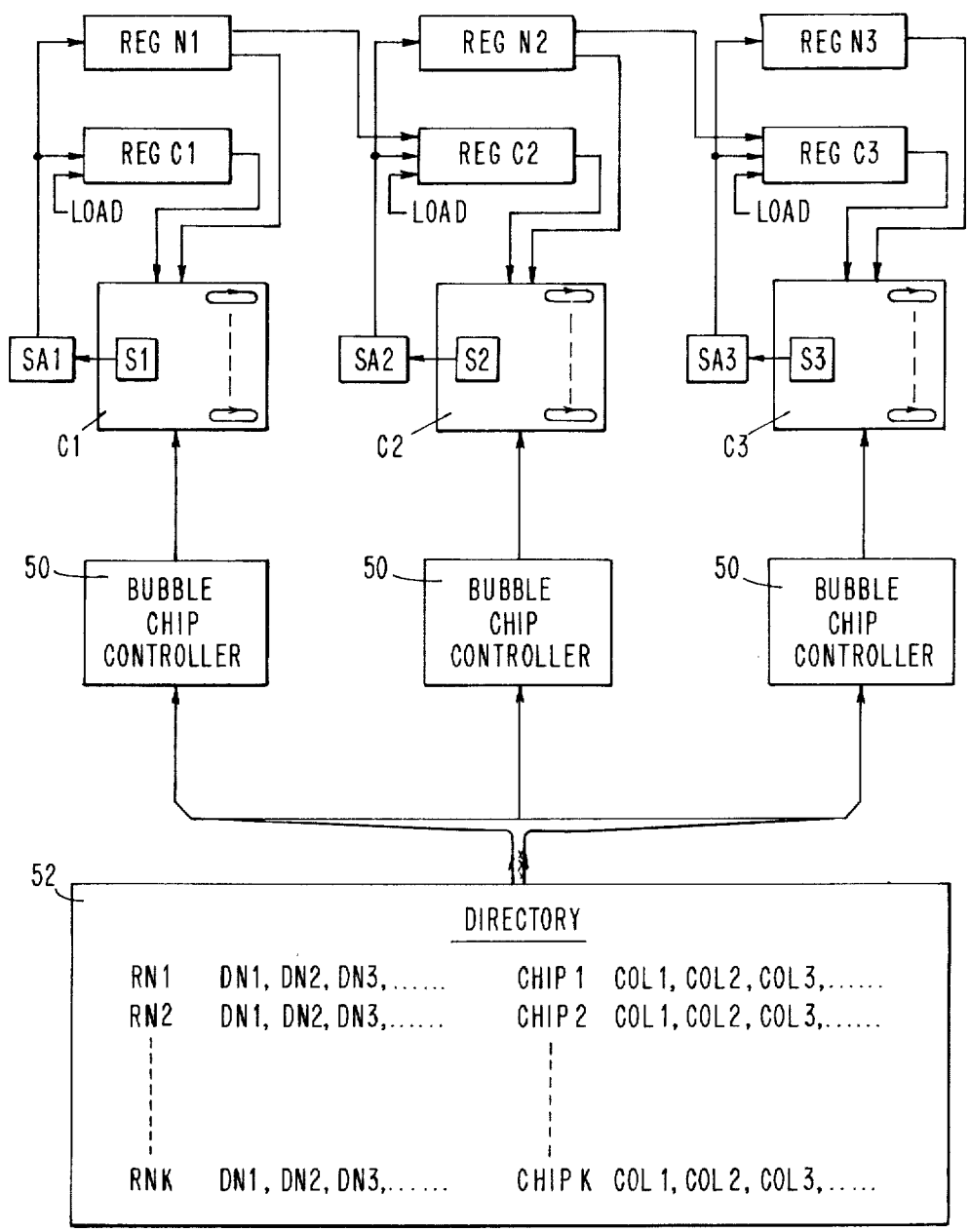
FIG. 2 shows a magnetic bubble domain relational data base system using a plurality (in this case three) magnetic chips as shown in FIG. 1, to form a relational data base system in which all necessary components are on the bubble domain chips.

The totally on-chip structure of FIG. 1 is used to store a complete table, or relation of data. By using a plurality of such magnetic chips, a relational data base system can be created. In FIG. 2, magnetic chips C1 and C2 store different data relations, while magnetic chip C3 is used to make a new relation, using the relations in chips C1 and C2.

In more detail, chip C1 (shown in detail in FIG. 1) includes a bubble domain sensor S1 whose output is an electrical signal coupled to sense amplifier SA1. The electrical output of the sense amplifier is provided to registers N1 and C1. These registers are used to store test criteria which can be applied to current carrying conductor 32 (FIG. 1) to set the tag currents used in the associative search devices 26. If test criteria is to be applied externally, the LOAD input to register C1 is used.

Magnetic chips C2 and C3 also have associated therewith registers N2, C2, and registers N3, C3, respectively. Sense amplifier SA2 is coupled to magnetic chip C2, while sense amplifier SA3 is coupled to magnetic chip C3. The output of SA2 is provided to both registers N2 and C2. The output of SA3 is provided to both registers N3 and C3. Additionally, register N1 is connected to register C2 while register N2 is connected to register C3. In this manner, data extracted from chip C1 can be used as test criteria (that is, tag currents) in magnetic chip C2, while data read from chip C2 can be used to determine test criteria in chip C3, via the interconnection between register N2 and register C3.

Bubble chip controllers 50 are provided for each of the chips C1–C3. Of course, a single bubble chip controller can be used to service more than one chip.

A directory 52 is used to provide inputs to the bubble chip controllers 50. The directory is a separate storage unit which could be comprised of a magnetic bubble domain storage or a semiconductor storage. Directories are well known in the art, and this particular one is used to store the addresses of all relations RN1, RN2, . . . RNK, as well as their domains DN1, DN2, . . . . In the directory shown, relation RN1 is located on chip C1, while relation RNK can be produced on chip C3. Of course, while only three magnetic chips are shown in FIG. 2, it will be realized by those of skill in the art that any number of chips can be provided and that the directory will keep track of the location of the different stored relations.

In using the apparatus of FIG. 2, a user input would be routed through directory 52, which in turn provides control inputs to the controllers 50 that are used to activate the current sources for each of the bubble domain chips. Circuitry is provided for updating the directory, depending upon whether or not the number of tables and the domains contained in each table are increased or decreased, and on whether the location of individual tables or individual domains in different magnetic bubble domain chips is changed. In the execution of queries in a data base system, each table stored in each bubble domain chip is considered to be somewhat of a separate entity. The user links together the various tables in order to answer his inquiries. Thus, separate tables are provided on separate magnetic bubble domain chips and the user goes from one chip to another. In the practice of the present invention, data need not be moved extensively from one chip to another. Instead, only qualified data is read from each of the bubble domain chips so that subsequent searches involve comparisons only with qualified data.

FIG. 3

This figure shows a complementary gate which can be used in the present invention. In addition, reference is made to the aforementioned literature for other examples of structures which will provide complementary data streams.

The gate of FIG. 3 provides an invert function so that a bubble domain stream R is inverted into a complementary stream $\overline{R}$. A bubble domain stream R is provided along the shift register 54. A pattern comprised of all bubble domains (1's) is propagated along shift register 56. Circle 58 indicates a region of interaction where the bubble domain data stream R interacts with the pattern of 1's. If there is a bubble domain in stream R which interacts with a bubble in the stream of 1's, the bubble domain in register 56 will be deflected downwardly along the direction of arrow 60 and will continue to propagate along register 62. On the other hand, if no bubble domain is present in data stream R, the bubble domain propagating along register 56 will continue in the direction of arrow 64, along register 66. Thus, register 66 will provide an inverted stream $\overline{R}$.

The complementary gate of FIG. 3 is useful to provide the data stream $\overline{R}$ and the inverted data stream R. The region of interaction 58 is a region where the shift registers 54 and 56 are sufficiently close that bubble domains in the two registers can interact. The use of interacting data streams along two adjacent registers is well known in the art, and particularly in bubble domain logic devices using bubble-bubble interaction. Many different circuit designs are available for this purpose.

TABULAR STORAGE (FIG. 4)

FIG. 4 illustrates tabular storage in a magnetic chip, such as that shown in FIG. 1. For ease of illustration, only the storage registers SR1, SR2, SR3, and SR4 are shown. These registers are comprised of rows of crosslinked loops L11 . . . L14, L21 . . . L24, L31 . . . L34, and L41 . . . L44, respectively.

This type of structure provides convenient storage of tables of data as represented by the EMPLOYEE table shown in FIG. 4. This table, or relation, is comprised of four columns, or domains, with the attributes NAME, DEPARTMENT (DEPT.), SALARY, and MANAGER (MGR.). Data is stored in rows and columns where a column of loops is used with each attribute. For example, the NAME column stores employee's names in the loops L11, L21, L31, and L41. In this particular example, there are four rows and four columns so that m=n=4 in FIG. 1.

Because the individual loops are cross-linked by the binary switches, columns of information can be exchanged. For example, the NAME column can be interchanged with the DEPARTMENT column in order to move the NAME column to the right toward the associative search devices. In order to access names, the NAME column is translated to the right-hand side of the storage area 11 (FIG. 1) where all tuples (rows) in the NAME column can be transferred at the same time to the associative devices 26.

FIG. 5

As was mentioned previously, a convertible structure, such as that shown in U.S. Pat. No. 3,967,263, can be used to provide serial access of information from the associative search devices 26, via the buffer loops BL1-BLn.

In a convertible structure arrangement, switches are provided on the ends of the buffer loops so that the bubble propagation paths can be connected in series for one setting of the switches, or information can idle in independent buffer loops for another setting of the switches. For example, FIG. 5 shows bubble propagation paths indicated by the arrows 68. If the switches S1a, S1b, S1c and S2a, S2b, and S2c are all in their down positions, then the bubble propagation paths will be connected in series and bubble domain information will propagate downwardly to the sensor S. Thus, for forward advance of bubble domain information in the buffer loops in a serial fashion, switch S1a is connected to terminal 2, switch S1b is connected to terminal 3, . . . . switch S2a is connected to terminal 5, . . . and switch S2c is connected to terminal 7.

In order to have information idle in separate buffer loops rather than being connected in series to a single I-O port, the switches are connected to provide propagation loops that are separate from one another. For example, the top-most buffer loop for idling information is achieved when switch S1a contacts terminal 1 while switch S2a contacts terminal 5. The second buffer loop for idling information is obtained by connecting switch S1b to terminal 2 and switch S2b to terminal 6. Correspondingly, the third idling buffer loop is obtained by connecting switch S1c to terminal 3 and switch S2c to terminal 7.

Information can be edited in the buffer loops using the structure and techniques taught in U.S. Pat. No. 3,950,732. That patent shows text editing operations within a single shift register in order to provide insertion of new information, deletion of existing information, write, read, and clear functions. Additionally, structure is shown therein for creating or closing a gap between bits, and for exchanging bits in a sequence of bits. This structure can be superimposed on the convertible structure shown in FIG. 5 so that large quantities of information can be idled while other information is moved to create gaps for insertion of new data. Thus, in FIG. 5, some of the buffer loops can be made to idle while others are connected in series, by an appropriate setting of the switches. For example, these techniques can be used together with a write decoder in a known manner (see U.S. Pat. No. 3,950,732) for changing information in the storage shift registers.

RELATIONAL DATA BASE OPERATIONS

As is well known in the field of relational data base systems, the basic capabilities required consist of only the traditional set operations Cartesian product, union, intersection, and difference, and the relational operations of projection, join, and restriction. To perform any of the four set operations, there must be two relations (or tables) on two separate magnetic chips, and the results are assembled on a third chip, using, for example, the system shown in FIG. 2. These operations are performed on one or more common or compatible attributes of the original tables. However, the new table may obtain other attributes from the original tables. Essentially all data base operations are performed on the magnetic chips in this invention. External circuits, such as semiconductor devices, are needed only as drivers for the write, read and associative search devices.

CARTESIAN PRODUCT

To perform this operation, the items of a selected column are read-out row by row from the first table. For example, the first table may be stored in chip C1 shown in FIG. 2. Read-out of rows from the first table is only of qualified data items. After each item has been read out, the first chip is arrested. A column is then selected from chip C2 and is read out row by row and matched with the items from the first chip. The entire column in chip C2 is read out row by row and each item in the column is matched with the just read-out item from the first chip.

The pairs while being matched are entered into a new table on chip C3. This process is repeated until the column of the first chip is completely read out to be matched with the column from the second chip. The Cartesian product of two sets C, D is denoted by $C \times D$, and is defined by $$C \times D = (c,d) : c \epsilon C \wedge d \epsilon D \tag{1}$$

UNION OPERATION

To perform the union operation, two compatible relations (or tables) from two separate chips are consecutively read out and written into a third chip to form a new table. The union of two sets C and D is denoted by $C \cup D$, and is defined by $$C \cup D = c : c \epsilon C \vee c \epsilon D \tag{2}$$

In more detail, the steps to perform this operation are the following:

1. Select columns from two compatible relations on two separate chips C1 and C2.

2. Read item(s) from chip 1.

3. Read matched item(s) from chip C2 and store in chip C3.

4. Repeat steps 2 and 3.

INTERSECTION OPERATION

To perform this operation, the items of a selected column in a chip C1 are read out row by row. While each item is being read out, the bubble signal is transformed into an electrical signal which is used in turn to perform an associative search on a selected column in the second chip C2. Thus, sense amplifier SA1 provides electrical signals to register N1 which in turn loads register C2. This determines the tag currents to the associative search devices in magnetic chip C2. The tag current is compared with a selected column in chip C2. If there is a match, the item is written into a table on the third magnetic chip C3. This process is repeated when all rows of the first chip have been read out and match is attempted with the column selected from the second chip. Matched items are written into chip C3 using the bubble chip controller 50 associated with that chip.

Thus, the steps for the intersection operation are the following:

1. Select corresponding columns from chips C1 and C2.

2. Read an item from chip C1.

3. Use that item to perform associative search on items from the selected column in chip C2.

4. If there is a match (mismatch), write the items from chips C1 and C2 into chip C3. If not, discard these items.

5. Repeat steps 2–4 for all rows of the first chip. The intersection of two sets C and D is denoted by $C \cap D$, and is defined by $$C \cap D = \{c : c \epsilon C \wedge c \epsilon D\} \tag{3}$$

To perform the difference operation, the procedure is similar to that of the intersection operation. The only difference is in that only at mismatch, rather than match, the item is used in the third (new) table. The difference of two sets C and D is denoted by $C - D$, and is defined by $$C - D = \{c : c \epsilon C \wedge c \notin D\} \tag{4}$$

PROJECTION RELATIONAL OPERATION

The projection operation manipulates a relation by dropping columns from a relation and then eliminating the resulting redundancy in the tuples (rows). The operation is executable by the following steps:

1. Move the undesired column(s) to the far left in the storage area 11 (FIG. 1), leaving the desired columns adjacent to the access circuitry.

2. Read out all the tuples successively via decoder 34. The read-out tuple is entered into a new table on chip C3.

3. After each readout step, the tuples just read can be transformed from a bubble signal to an electrical signal by the sensors S. This electrical signal is then used to perform an associative search on the original table. For example, an electrical signal from SA1 can be sent to register C1 and then appear as a tag current on conductor 32. All the matched shift registers will be sealed off after the search.

4. The above process is repeated until the entire original table has been read out from chip C1. The sealed-off tuples are never read out.

Assume an m-ary relation R contains n tuples, r (i.e., a table of m columns and n rows). Let A=(j1, j2, ..., jk), a subset, and select the columns from the set (1; 2, ... m), then, the projection of R on A is defined by $$R[A] = \{r[A] : r \epsilon R\} \quad (5)$$

JOIN OPERATION

This operation forms a new relation from two separate relations and does not use all the attributes of these two separate relations. This new relation can be based on any of the relations =, $\neq$, <, $\leq$, > and $\geq$, which is applied to compatible attributes from the two original relations. For example, these relations can be on chips C1 and C2.

The steps for the join operation are the following:

1. In each original table in chips C1 and C2, move the compatible columns close to the associative search devices 26, followed by other columns to be used in the new table to be placed in chip C3.

2. Read out from the compatible column of one table, via the decoder 34, one row at a time from the top. The row just read out is temporarily stored in chip C3.

3. While reading out, the relevant attribute, in its electrical signal form, is used in chip C2 to perform an associative search on items in chip C2.

4. If the search yields tuples in the second table, these tuples are read out and written into the third table in chip C3 to be joined with the temporarily stored tuple from the first table by Cartesian product. The resulting tuples are stored permanently. However, if the search yields no tuple in the second table in chip C2, the temporarily stored tuple in chip C3 is erased.

5. Steps 2-4 are repeated until the first table has been read out completely from chip C1.

Let $\theta$ denote any of the relations =, $\neq$, <, $\leq$, > and $\geq$. The $\theta$-join of relation R on domain A with relation S on domain B is defined by $$R[A \theta B]S = \{(rs) : r \epsilon R \wedge s \epsilon S \wedge (r[A]\theta s[B])\} \quad (6)$$

The restriction operation is a special case of the join operation in which two original relations are identical.

FIG. 6

In the practice of the present invention, the hardware design of the chip has a close resemblance to the relational data model. The data items are arranged in a two-dimensional array. Columns are interchangeable in position by the operation of the cross-linked loops, and the rows are equally accessible via the decoder. There are no built-in data linkages such as indices or pointers which are required in other relational data base systems. On the contrary, during query, relevant data items are quickly identified by associative search and easily accessed via the decoder.

Figure 6:
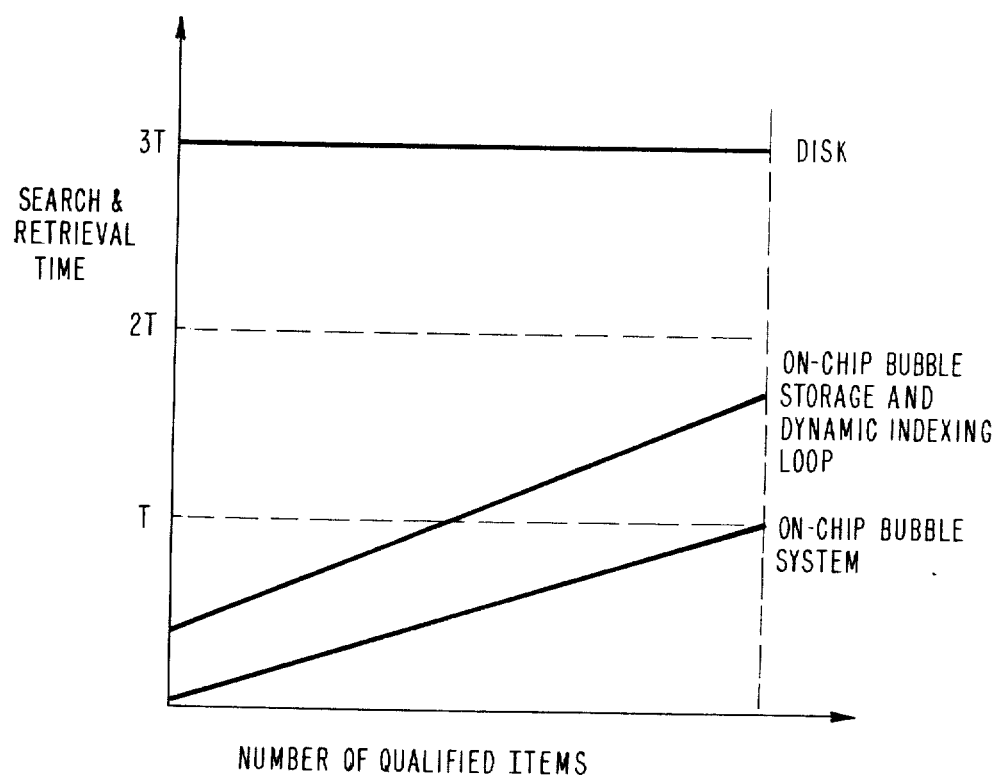
FIG. 6 shows typical performance gains achievable with relational data-base bubble chips with on-chip functional components as compared with prior relational data base systems.

FIG. 6 illustrates the improvement in operation of the relational data base system of the present invention in comparison with prior art relational data base systems. In this graph, the "on-chip bubble system" is the present relational data base system, while the "on-chip bubble storage and dynamic indexing loop system" is the system described in aforementioned copending application Ser. No. 902,641, filed May 4, 1978. That prior art system used bubble domain storage and an external dynamic indexing loop which kept track of cumulative comparisons.

The other relational data base system contrasted in this graph is one using magnetic disk storage in the manner described in the references set forth in the introduction of this specification.

This graph plots search and retrieval time as a function of the number of qualified items determined as a result of a comparison. These curves are based on a situation in which all items in a tuple are assumed to be potentially qualifiable. Thus, an entire tuple is subjected to associative search and if qualified is then retrieved. Still further, FIG. 6 illustrates the situation in which a single query is made on a single chip; the differences in query time shown there will be even greater when more complex queries using several chips are involved (e.g., T is proportionate to $N^2$ if two relations are to be joined, N=number of qualified items).

The search and retrieval time plotted along the ordinate is the amount of time required for search and comparison, as well as the delivery of qualified data. The quantity T is the time required to traverse all stored data once.

For relational data base systems using disk storage, a time 3T is required. One revolution of the disk is required to obtain a starting mark for the data track and another revolution of the disk is required for read-out of data for associative search. One further cycle time T is required to deliver the qualified items. Cycles 2 and 3 cannot be combined without a buffer as large as the track in storage capacity.

In the case of the completely on-chip bubble domain system of the present invention, data rearrangement and simultaneous search on the chip means that it is possible to minimize the search time to approximately zero. Also, facilities can be provided to leave no gaps when retrieving qualified items. The query time (that is, search and retrieval time) is dominantly determined by retrieval. A linear curve results whose steepness is equal to the retrieval time per item. Since, typically, only a small fraction of the items searched will qualify, the query time is usually a small fraction of T (that is, the time required to serially traverse all data. Even in the worst case in which all data items are qualified items, there is still a significant improvement with respect to relational data base systems using magnetic disks for storage. In a typical case, the query time will be reduced by approximately $10^2$–$10^3$ times with respect to conventional disk architecture.

The relational data base system using on-chip bubble storage and external circuitry for comparison operations requires search and retrieval times intermediate those of the present system and the prior art disk systems. The curve for this system will be more steep than the curve for the totally on-chip bubble system and its starting point along the ordinate will also be higher. This is due to the fact that major/minor loop types of organizations have been used in such prior art architecture and that gaps result between retrieved data items.

The improvement in search and retrieval time, i.e., query time, in the architecture of the present invention becomes even more enhanced when complex queries involving many chips are required. The improvements for one chip, illustrated by the simple query example of FIG. 6, multiply together to produce even greater systems' advantages as the amount of the data base increases and as the complexity of the queries increases.

FIG. 6 points out the dependence of the query time on the number of qualified items. Since typically only a small fraction (say 1/1,000–1/100) of the items searched will satisfy the test criteria, improvements (reductions) in total query time (search, retrieval, etc.) of 100–1,000 can be achieved as compared to conventional organizations which waste time in total retrieval before searching.

While no user's view is imposed on the storage of data, all users can formulate queries and access the data with equal convenience and speed. The on-chip search and identify capability preempts the need to move irrelevant data through the input/output ports. The start-stop capability eliminates idle times between accesses.

While the term "data base" carries the connotation of a huge collection of data, modular bubble chips may well prove useful at more modest capacity. The rather small number of essential operators lend themselves to keyboard operations, and simple device functioning set forth therein needs very limited logic and programming. For this reason, it is conceivable that a calculator-size query machine could be constructed using the principles of this invention. Of course, the concepts presented and the hardware discussed herein are equally useable for large data base systems and are amenable to high-level language for non-programmers.

Having thus described my invention, what I claim as new, and desire to secure by Letters Patent is:

1. A magnetic bubble domain relational data base system using magnetic bubble domain devices, comprising:

a plurality of interconnected bubble domain chips, each of which includes at least one magnetic bubble domain storage chip for storing in tabular form on said chip a table of data forming a relation, said table including a plurality of rows and columns wherein said data is represented by coded magnetic bubble domains arranged in said columns and rows in said magnetic storage chip, said data having a predetermined relationship determined by said table of related data, and wherein each said storage chip includes:

a plurality of rows of parallel shift registers on said chip for storage of said data in the form of said coded bubble domains, each of which is segmentized into loops located along said rows where the loops of adjacent shift registers form columns of loops, and the loops of any one shift register form a row of said loops, switch means on said chip and between adjacent loops in each row of loops for cross-linking said adjacent loops to interchange data between cross-linked loops, said switch means including means to cross-link loops in two columns of loops in said storage, a plurality of associative search means on said magnetic chip for receiving data transferred from said shift registers to said associative search means and for parallel comparison of data from each row of shift registers with test criteria delivered to said associative search means wherein data which satisfies said test criteria is termed qualified data, said associative search means including gate means for blocking passage to an output means of bubble domains from those shift registers where mismatch with said test criteria is obtained and for allowing passage to said output means of bubble domains representing qualified data, there being one said associative search means for each shift register in said storage chip, transfer means located on said chip for transferring data in parallel from a column of loops in said shift registers to said plurality of associative search means, output means on said bubble domain chip for connecting each associative search means having qualified data therein with a single input/output port wherein simultaneous search of each row of shift registers occurs on said bubble chip prior to retrieval of qualified data items, interconnection means connecting the output of a first bubble domain chip to the plurality of associative search means on a second bubble domain chip for using the output of said first chip as a test criterion in the associative search means of said second chip.

2. The system of claim 1, where said each associative search means receives the same test criterion, each associative search means including a common current carrying conductor along which currents flow representing said test criterion.

3. The system of claim 2, further including at least one register whose output is connected to said associative search means, the content of said at least one register being said test criterion along said common conductor to each said associative search means.

4. The system of claim 3, where said switch means are located between adjacent loops of each said shift register, the switch means between adjacent columns of loops being actuated in parallel by a current carrying conductor common to all said switches in a column of said switches.

5. The system of claim 1, where said output means is a decoder for random access of the outputs of each said associative search means.

6. The system of claim 1, further including a buffer register connected to each said associative search means for each shift register, where said output means is a convertible structure connected to said buffer registers for serial access of the contents of said buffer registers, said convertible structure being comprised of a plurality of switches between said buffer registers for connecting said buffer registers in series to form one long shift register for advancing data in said buffer registers in series.

7. A magnetic bubble domain relational data base system comprising:

a plurality of magnetic bubble domain chips, each of said chips including a magnetic medium in which information can be stored in the form of coded bubble domains, said coded bubble domains being stored in said magnetic medium in rows and columns forming a table of related information, said rows and columns being comprised of shift register loops arranged in rows and columns along which said magnetic bubble domains propagate in response to appropriate drive fields applied to said magnetic medium, magnetic switch means on each of said chips for interconnecting adjacent shift register loops in any row of shift register loops, said magnetic switch means including means for serially connecting adjacent shift register loops to cause exchange of bubble domain information between said connected adjacent shift register loops while retaining said information in storage, magnetic means located on each of said chips for simultaneously transferring magnetic bubble domain information from a column of said shift register loops to a plurality of associative search means located on each of said magnetic chips, there being an associative search means for each shift register loop in said column of shift register loops, wherein each said associative search means includes a comparator means for comparing bubble domain information taken from a shift register loop with test criteria applied to said comparator means, means for applying the same test criteria to all of said associative search means on a chip at the same time, a bubble domain sensor located on each of said chips for sensing said coded bubble domains, output means on each of said chips located between said associative search means and said magnetic bubble domain sensor for connecting the outputs of said plurality of associative search means to said bubble domain sensor after simultaneous search of a column of said shift register loops, gate means located on each of said chips for blocking a passage of magnetic bubble domain information which does not satisfy said test criteria from movement to said output means, electrical means interconnecting said plurality of magnetic bubble domain chips and providing an electrical connection between the output of said sensor on a first magnetic bubble domain chip and the plurality of associative search means on a second magnetic bubble domain storage chip so that the output information from said first magnetic bubble domain chip can be used as the test criteria in the plurality of associative search means located on said second magnetic bubble domain storage chip.

8. The system of claim 7 further including binary switches located between each of said shift register loops for selective interconnection of adjacent loops to create a single closed shift register containing the information previously contained in the noninterconnected adjacent loops, depending upon the activation of said binary switches.

9. The system of claim 8, further including means for activating all of the binary switches located between two columns of shift register loops in order to interchange data in said two columns of loops.

10. The system of claim 9, where said output means is a decoder means on said chip for connection of the output of a selected one of said plurality of associative search means to said sensor.

11. The system of claim 9, where said output means is an on-chip bubble domain circuit for serially connecting the outputs of said plurality of said associative search means on said bubble domain chip to said bubble domain sensor.

12. The system of claim 11, further including on-chip buffer registers located between each of said associative search means and said output means for storing bubble domain information from said associative search means.

13. The system of claim 7, including means for interchanging columns of information in said stored table of information without transferring information from columns to said plurality of associative search means.

* * * * *